(12) United States Patent
Kise et al.

(10) Patent No.: US 6,743,648 B2
(45) Date of Patent: Jun. 1, 2004

(54) METHOD FOR FABRICATING A SET OF DISTRIBUTED FEEDBACK SEMICONDUCTOR LASERS

(75) Inventors: Tomofumi Kise, Tokyo (JP); Masaki Funabashi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/167,706

(22) Filed: Jun. 13, 2002

(65) Prior Publication Data

US 2003/0008426 A1 Jan. 9, 2003

(30) Foreign Application Priority Data

Jun. 14, 2001 (JP) ........................................ 2001-179821
Mar. 18, 2002 (JP) ........................................ 2002-073700

(51) Int. Cl.[7] .............................................. H01L 21/00
(52) U.S. Cl. .............................. 438/22; 438/25; 372/26
(58) Field of Search ........................... 438/22, 28, 478; 372/96; 385/37

(56) References Cited

U.S. PATENT DOCUMENTS

| | | | | |
|---|---|---|---|---|
| 5,357,591 A | * | 10/1994 | Jiang et al. | .................... 385/37 |
| 5,970,081 A | * | 10/1999 | Hirayama et al. | ............ 372/96 |
| 6,151,351 A | * | 11/2000 | Kito et al. | ...................... 372/96 |
| 6,376,338 B2 | * | 4/2002 | Ekawa et al. | ............... 438/478 |
| 2002/0106823 A1 | * | 8/2002 | Hwang et al. | ................ 438/22 |

FOREIGN PATENT DOCUMENTS

| | | | | |
|---|---|---|---|---|
| EP | 1 227 556 A2 | * | 7/2002 | ............. H01S/5/12 |
| JP | 2000-101187 | | 4/2000 | |

* cited by examiner

Primary Examiner—W. David Coleman
(74) Attorney, Agent, or Firm—Oblon, Spivak, McClelland, Maier & Neustadt, P.C.

(57) ABSTRACT

A method for forming a set of DFB lasers includes the steps of forming active layers having different peak gain wavelengths, measuring the peak gain wavelengths of the active layers, and forming diffraction gratings having periods based on the measured peak gain wavelengths, the periods allowing the detuning amount of the DFB laser device to fall within a design value.

8 Claims, 9 Drawing Sheets

METHOD FOR FABRICATING A SET OF DISTRIBUTED FEEDBACK SEMICONDUCTOR LASERS

BACKGROUND OF THE INVENTION

1. Field of the Invention

The present invention relates to a method for fabricating a set of distributed feedback (DFB) semiconductor laser devices. More particularly, the present invention relates to a method for fabricating on a single wafer a plurality of DFB semiconductor laser devices, designed to emit laser beams having desired wavelengths different from one another by short step differences. In addition, the present invention relates to a method for fabricating a set of DFB semiconductor lasers best suited for light sources for use in a wavelength division multiplexing scheme in optical transmission systems.

2. Description of the Related Art

A wavelength division multiplexing (WDM) optical transmission system transmits optical signals having a plurality of different wavelengths via a single optical fiber to greatly expand the capacity of the optical transmission system. As the light source for use in the optical transmission system, a DFB semiconductor laser device is generally employed due to the excellent wavelength selectivity thereof.

The WDM optical transmission system mainly employs wavelength bands in the ranges of 1530 nm to 1565 nm (C-band wavelengths) and 1565 nm to 1625 nm (L-band wavelengths). Each band requires a set of DFB lasers that provide a lineup of a few tens of wavelengths different from one another by a 100 GHz (about 0.8 nm) or 50 GHz (about 0.4 nm) step wavelength in accordance with the ITU Grid.

The lasing wavelength $\lambda_{DFB}$ of a DFB laser device can be set independently of the peak gain wavelength of the active layer, which corresponds to the photoluminescence wavelength $\lambda_{PL}$, and thus the peak gain wavelength is assumed the same as $\lambda_{PL}$ hereinafter. Assuming that $\Lambda$ is the spatial period of the diffraction grating and $n_{\it eff}$ is the effective refractive index of the waveguide, the lasing wavelength $\lambda_{DFB}$ is expressed by $$\lambda_{DFB} = 2\Lambda n_{\it eff}.$$

The difference $\Delta\lambda$ between the peak gain wavelength $\lambda_{PL}$ and the lasing wavelength $\lambda_{DFB}$ should fall within a certain range to provide an excellent lasing property of the DFB laser device. The difference $\Delta\lambda$ ($=\lambda_{DFB}-\lambda_{PL}$) is generally called amount of detuning or "detuning amount".

The optimum detuning amount depends on the purpose. For example, the desired detuning amount for lasing at a lower threshold current is preferably −10 nm to +10 nm. On the other hand, to provide a higher-speed operation and achieve a reduced spectrum width, the detuning amount is preferably −20 nm to 0 nm, whereas the detuning amount is preferably 0 nm to +20 nm to provide an improved operation at high temperatures and a higher optical output.

In this context, extensive studies are conducted on the method for fabricating a plurality of DFB lasers on a single wafer at a time, in which the DFB laser devices satisfy the predetermined detuning condition and provide the lineups of C-band and L-band wavelengths.

One of the methods is described in JP Patent Laid-Open Publication No. 2000-101187. FIG. 1 is a schematic sectional view illustrating the main configuration of the DFB laser devices described therein, wherein diffraction gratings 24 are first formed on an InP substrate 12 of a 2-inch wafer, to have respective periods which increase along with the radial position of the wafer and concentrically with the wafer. Then, by using a semiconductor epitaxial growth system, active layers 16 of strained InGaAsP multi-quantum well (MQW) structures having bandgap wavelengths that satisfy the above detuning condition are formed in accordance with the lasing wavelength distribution, the lasing wavelengths being generally determined by the periods of the diffraction gratings 24. Thus, the DFB laser devices having the structure as shown in FIG. 1 are fabricated. As shown in FIG. 1, the diffraction grating 24 is formed in the vicinity of the InP substrate 12 with respect to the active layer 16.

It is recited in the publication that the above arrangement makes it possible to efficiently fabricate a plurality of DFB laser devices on a single wafer, each of the DFB laser devices having a unique emission wavelength.

In the method described in the publication, the diffraction gratings 24 each having a unique period are first formed within the surface of a wafer. Then, the active layers 16 having bandgap wavelengths that satisfy the specified detuning condition is formed in accordance with the lasing wavelength distribution of the diffraction gratings 24. The method described in the publication, however, involves the following problems.

First, in the current epitaxial growth techniques, it is practically difficult to fabricate active layers having a specified composition, with a suitable reproducibility in the mass production. This in turn makes it difficult to allow the detuning amounts of the DFB lasers to fall within the range of the specified detuning amount.

Second, when the active layers formed do not provide the predetermined distribution of bandgap wavelengths, the detuning amounts are to be different from the predetermined detuning amount, because the diffraction gratings are fabricated prior to the active layers. As a result, it is necessary to iterate the fabrication process of the DFB laser devices from the beginning, including the formation of the active layer and the diffraction gratings. This makes it difficult to improve the productivity of the DFB laser devices.

SUMMARY OF THE INVENTION

It is therefore an object of the present invention to provide a method for fabricating a plurality of DFB laser devices on a single wafer at a time with ease, in which each DFB laser device satisfies the specified detuning condition and emits a laser beam at a unique wavelength.

The present invention provides a method for fabricating a plurality of DFB semiconductor laser devices on a single wafer at a time. Each of the DFB semiconductor laser devices emits a laser beam having a unique wavelength which differs from another wavelength by a certain step. The method includes the steps of measuring peak gain wavelengths of the active layers within the wafer surface, and forming diffraction gratings based on the measured distribution of the peak gain wavelengths of the active layers within the wafer surface, the diffraction gratings having specified periods that allow the detuning amounts of the active layers to fall within a specified range.

According to the method of the present invention, in-plane variances in the bandgap wavelengths of the active layers can be evaluated in advance prior to the formation of the diffraction gratings. Thus, in consideration of the results of the evaluation, the periods of the diffraction gratings can be designed, thereby making it possible to control the lasing frequencies with a high degree of reproducibility within the wafer surface.

In accordance with the method of the present invention, since the detuning amount is controlled to fall within the specified range across the wafer surface, it is possible to provide a plurality of DFB laser devices which are fabricated uniformly within the wafer surface and operative at a lower threshold current and a higher efficiency.

The above and other objects, features and advantages of the present invention will be more apparent from the following description, referring to the accompanying drawings.

DETAILED DESCRIPTION OF THE PREFERRED EMBODIMENTS

Figure 1:
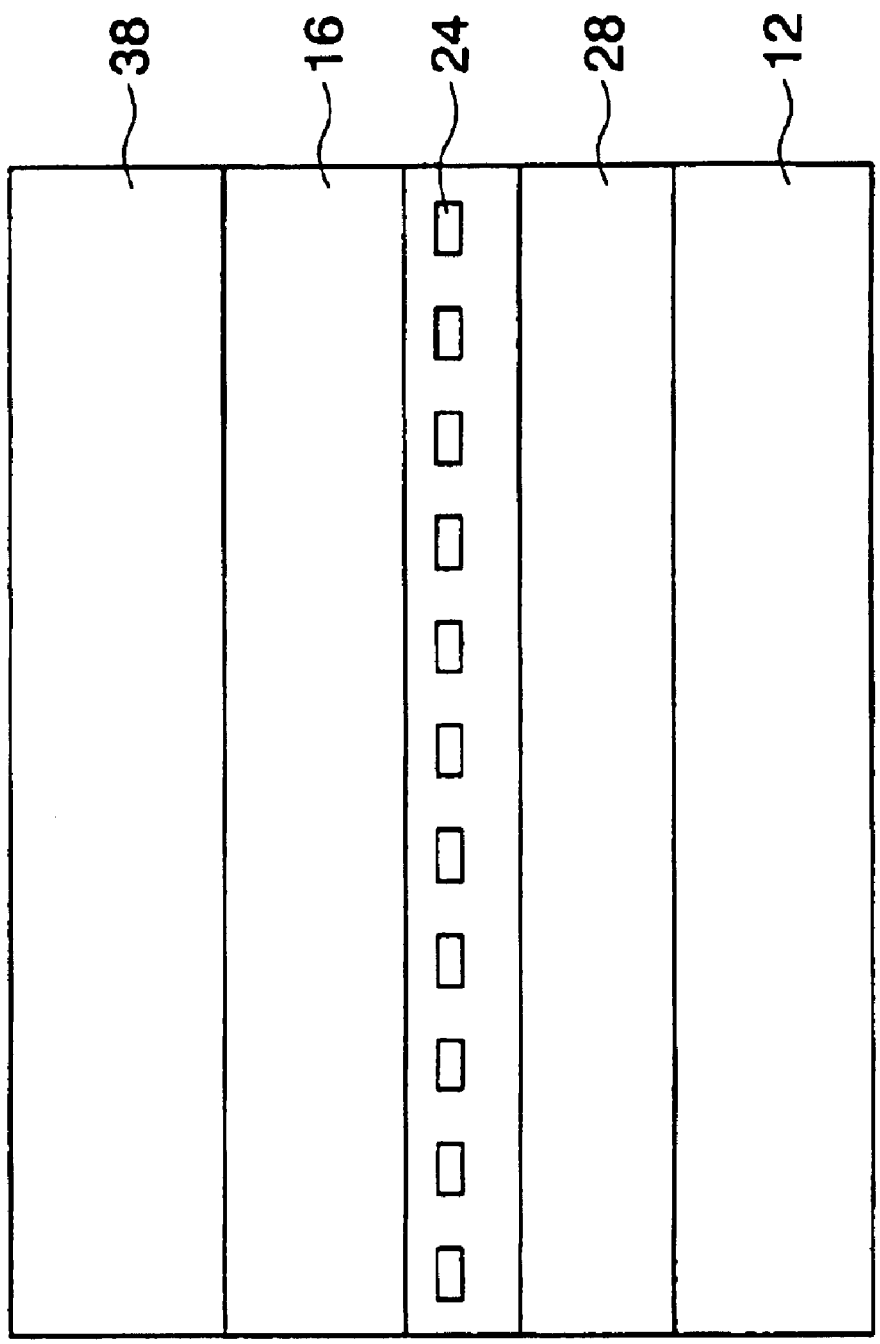
FIG. 1 is a longitudinal-sectional view illustrating the structure of one of a plurality of DFB laser devices fabricated by using a conventional method.

Before describing the preferred embodiments of the present invention, the principle of the present invention will be described for a better understanding of the present invention.

The inventors first noted that the EB lithography can be employed to form diffraction gratings with high accuracy, under relatively easy control, and with a higher degree of reproducibility. This led to an idea of first forming the active layers which are generally formed with a relatively low controllability in the material composition thereof, and then measuring the photoluminescence (PL) wavelengths of the active layers. Subsequently, based on the PL wavelengths thus measured, the diffraction gratings are formed by EB lithography with high accuracy to have periods which allow the respective detuning amounts to fall within the desired range for the detuning amounts.

More specifically, the active layers, which have a quantum well structure and have periodically varying thickness within the wafer surface, are formed in accordance with the temperature distribution within the wafer surface or by changing the flow rate of a source material gas. Thus, a distribution of peak gain wavelengths is created for the active layers within the wafer surface.

Subsequently, the PL wavelengths of the active layers are measured and mapped within the wafer surface. For example, a concentric temperature distribution within the wafer surface can provide the active layers with a concentric distribution of the PL wavelengths, wherein the difference between the maximum and minimum of the PL wavelengths in the distribution assumes 40 nm or greater.

In accordance with the mapped PL wavelength distribution, diffraction gratings are designed to have a distribution of the periods that satisfy the predetermined detuning condition, and the diffraction gratings having the design periods are formed above the active layers.

In general, in the step of forming the layered structure, such a layered structure may be unintentionally formed on the wafer, which includes a compound semiconductor layer structure that implements a plurality of active layers having peak gain wavelengths which vary depending on the specific regions of the wafer surface in which the active layers are formed. The method of the present invention is preferably applicable to such a case.

In this respect, such a layered structure should be intentionally formed on the wafer that includes the compound semiconductor layer structure that implements the active layers having peak gain wavelengths which vary in a region by region basis within the wafer surface. A preferred embodiment of the present invention includes the measuring step subsequent to the step of forming on a wafer the compound semiconductor layer structure which implements the active layers having unique peak gain wavelengths wherein the peak gain wavelengths are varied depending on the region in which the active layers are formed within the wafer surface.

When the active layers are formed in the step of forming the layered structure, the temperature distribution over a wafer stage, on which the wafer is placed, preferably assumes a concentric distribution which is concentric with respect to the wafer surface. By using the concentric temperature distribution, the peak gain wavelengths of the active layers assumes a concentric distribution concentric with respect to the wafer surface.

In the step of forming the layered structure according to the preferred embodiment of the method of the invention, a diffraction grating layer is allowed to grow on the active layer with an intervention of a spacer layer. In the step of forming the individual diffraction gratings, an etching mask for patterning the diffraction grating layer is preferably formed by using electron beam (EB) photolithography. This makes it possible to form diffraction gratings having desired periods with high accuracy.

As described in JP Patent Laid-Open Publication No. 2000-101187, the peak gain wavelengths of the active layers may assume a concentric distribution profile within the wafer surface to follow a quadratic function of the distance from the center of the wafer. This may provide a constant yield per lasing frequency of the DFB laser devices.

In contrast to the described technique, the method of the present invention achieves a distribution of peak gain wavelengths of the active layers within the wafer surface so as to provide a plurality of desired unique lasing wavelength in respective regions of the wafer, i.e., unique lasing wavelength different from one another on a region by region basis.

On the other hand, it is also possible to provide a similar distribution of the peak gain wavelengths of the active layers by using a selective area growth by MOCVD using dielectric masks.

In this context, in the step of forming a layered structure in a method according to the preferred embodiment of the invention, formed are dielectric films for selective area growth and have widths which vary so as to vary the peak gain wavelengths of the active layers depending on the regions in which the active layers are formed within the wafer surface. Using the selective growth blocking masks, the active layer is then grown by a selective area growth by MOCVD.

On the other hand, to obtain a concentric distribution of peak gain wavelengths within the wafer surface, the step of forming the layered structure uses the selective growth blocking masks made of dielectric film and having widths which are varied so as to vary the peak gain wavelength of the active layers at each concentric annular region within the wafer surface. Using the selective growth blocking masks, the active layers are then grown by a selective area growth by MOCVD.

The method of the present invention is applicable independently of the material compositions of the substrate and the compound semiconductor layers that constitute the semiconductor laser device.

The method of the present invention is preferably applied to fabrication of a plurality of DFB semiconductor laser devices which emit the C-band or L-band wavelengths defined in the wavelength division multiplexing optical transmission system, the wavelengths having a difference of 30 nm or more between the maximum and minimum wavelengths.

Now, the present invention will be described below in more detail based on embodiments of the present invention with reference to the accompanying drawings, wherein similar reference numerals denote similar constituent elements throughout the drawings.

Embodiment 1

Figure 3:
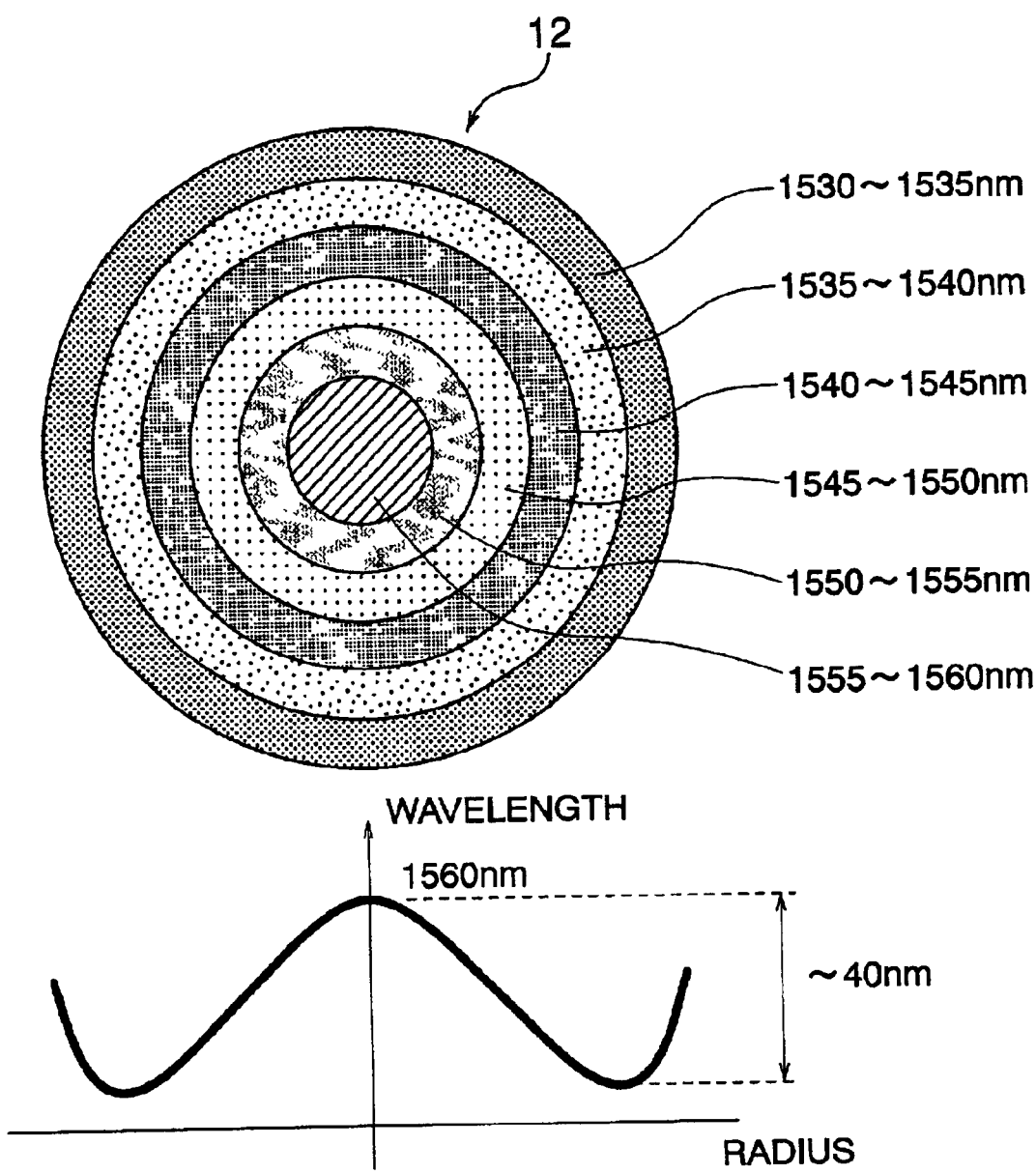
FIG. 3 is a top plan view of a wafer, illustrating the peak gain distribution of the DFB laser devices achieved within the wafer surface.
Figure 4:
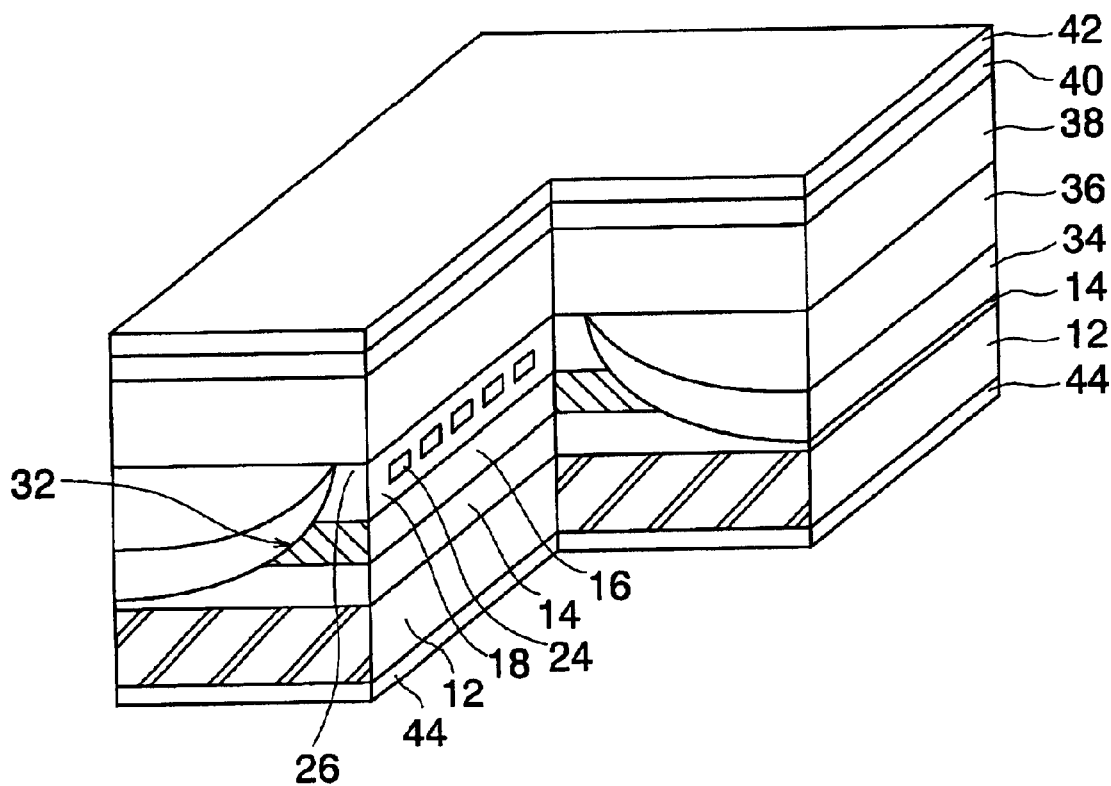
FIG. 4 is a schematic perspective view illustrating the arrangement of diffraction gratings in the DFB laser device fabricated by the method of the embodiment.

The present embodiment is directed to a method for fabricating a DFB semiconductor laser device according to the present invention. FIGS. 2A to 2I are sectional views each illustrating a step of a method for fabricating a DFB laser device according to the present embodiment. FIG. 3 is a schematic top plan view of a wafer, illustrating the lasing wavelength distribution of the diffraction gratings fabricated by the method of the present embodiment, and FIG. 4 is a schematic perspective view illustrating one of the DFB laser devices fabricated by the method of the present embodiment.

This embodiment provides a method for fabricating a plurality of DFB laser devices on a 2-inch wafer at a time, the DFB laser devices providing a lineup of C-band wavelengths (1530 nm to 1560 nm).

Figure 2A:
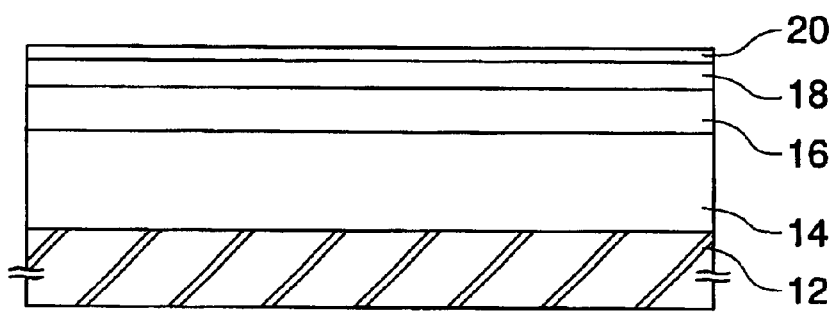
FIGS. 2A to 2I are sectional views each showing a DFB laser device at a step of a method for fabrication thereof according to an embodiment of the present invention.

First, an n-InP buffer layer 14, a MQW-SCH active layer 16, a p-InP spacer layer 18, and an InGaAsP diffraction grating layer 20 are epitaxially grown in sequence on a substrate of a 2-inch n-InP wafer 12 at a growth temperature of 600° C. using a MOCVD epitaxial growth system, thereby forming a layered structure as shown in FIG. 2A.

Upon growing the active layer 16, the wafer stage, on which the wafer is placed, is subjected to a temperature profile following a concentric temperature distribution.

The bandgap energy of the active layers 16 at the central region of the wafer is designed to be around 1560 nm in terms of wavelength.

The p-InP spacer layer 18 and the InGaAsP diffraction grating layer 20 are 200 nm and 20 nm thick, respectively.

Subsequently, the photoluminescence wavelength (PL wavelength) is measured and mapped within the surface of the 2-inch wafer, on which the diffraction grating layer 20 is formed.

It is to be noted that, when grown by using a MOCVD technique, the InGaAsP layer may be provided with a different composition of materials by using a different growth temperature. This is because there is a significant difference in the rate of thermal decomposition between arsine ($AsH_3$) and phosphine ($PH_3$), which are a group-V source material gas. The significant difference causes the phosphine having a lower thermal decomposition rate to be increasingly decomposed as the growth temperature increases, thereby allowing the material composition of the grown layer to become richer in phosphor. A phosphor-richer composition reduces the lasing wavelength of the DFB laser.

Thus, a temperature distribution profile provided on the wafer stage, on which the wafer is placed, upon growing the active layer allows for producing a concentric distribution of bandgap wavelengths within the wafer surface as shown in FIG. 3.

Furthermore, as shown in FIG. 3, the active layers can be grown in controlled conditions such as pressure and flow of source material gas, thereby providing a difference of about 40 nm between the maximum and minimum PL wavelengths.

On the other hand, there may occur a natural periodic distribution of PL wavelengths depending on the structure of the MOCVD epitaxial growth system. In such a case, it is sometimes unnecessary to provide a temperature distribution on the wafer stage.

Subsequently, diffraction gratings having different periods which vary within the wafer surface are fabricated in accordance with the mapping of the PL wavelengths.

Figure 2B:
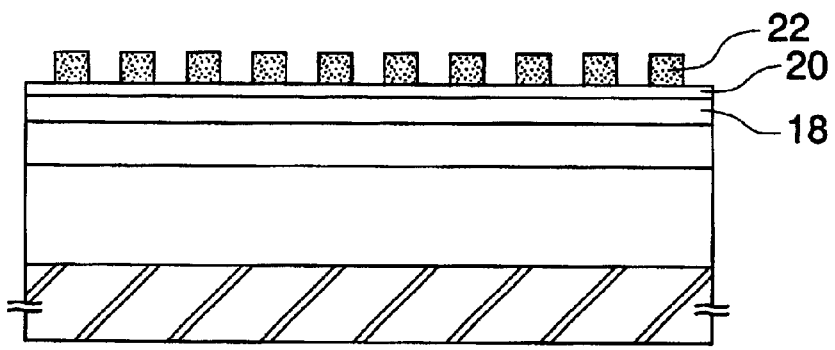

As shown in FIG. 2B, to fabricate the diffraction grating, a resist for an electron-beam (EB) lithography is first coated in a thickness of about 100 nm on the diffraction grating layer 20, thereby forming a resist film on the wafer. Subsequently, based on the predetermined detuning condition, patterned mask 22 for the diffraction gratings are formed by using an EB lithography system, to provide the mask with spatial periods which are concentrically varied in the range of 239.8 nm to 244.5 nm within the wafer surface.

Thus, as shown in FIG. 3, the lasing wavelengths are set between 1530 nm and 1560 nm in accordance with the PL wavelength mapping within the wafer surface.

Figure 2C:
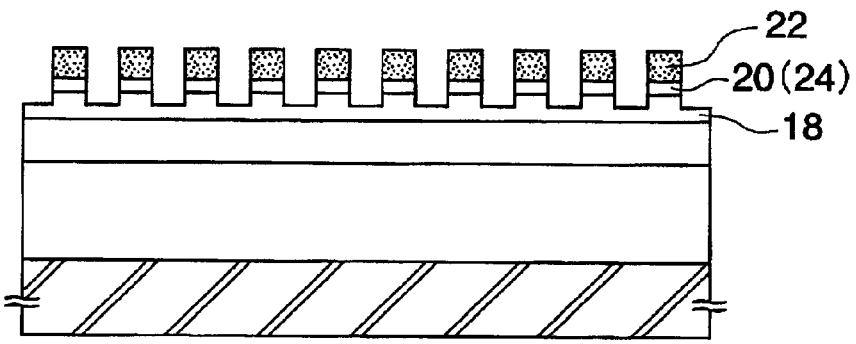

Thereafter, while using the patterned mask 22 of the resist as an etching mask, the InGaAsP diffraction grating layer 20 is etched in a dry etching system to form diffraction gratings 24 such as shown in FIG. 2C. The duty ratios of the diffraction gratings are on the order of 25%. It is to be noted that the InGaAsP diffraction grating layer 20 is not necessarily 20 nm in thickness and may be 30 nm.

Figure 2D:
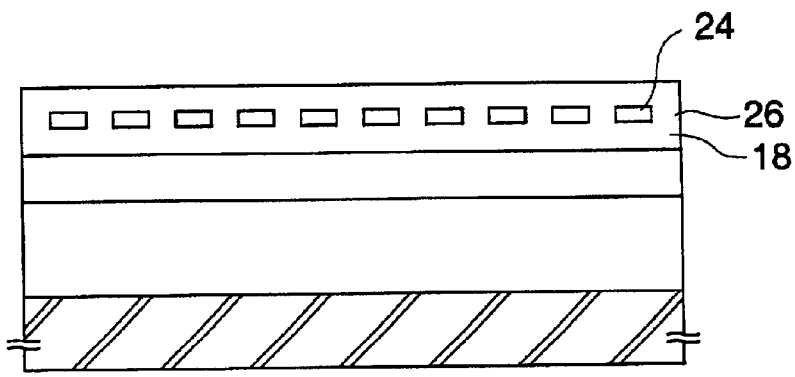
Figure 2E:
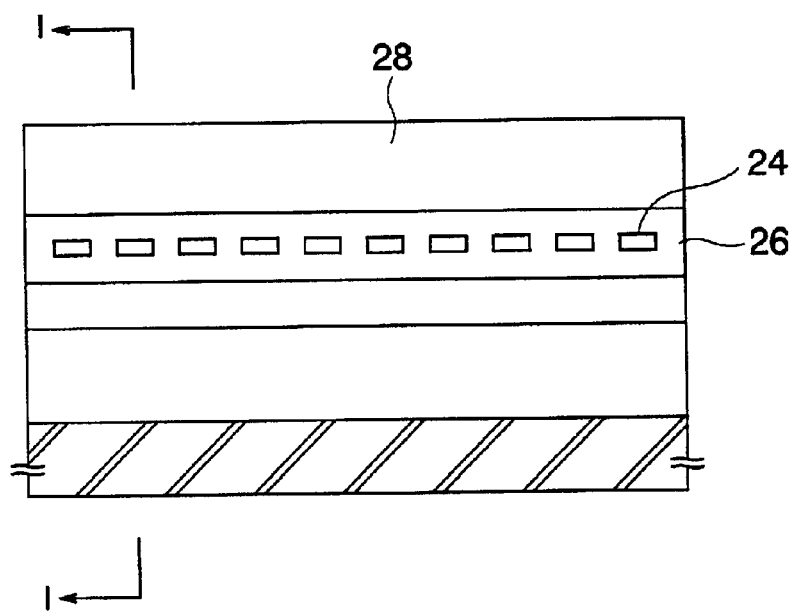

Subsequently, by using a MOCVD system, a p-InP embedding layer 26 is re-grown on the diffraction gratings 24, as shown in FIG. 2D, to thereby embed the diffraction gratings 24 within the p-InP embedding layer 26, followed by growing thereon a p-InP cladding layer 28 as shown in FIG. 2E.

Figure 2F:
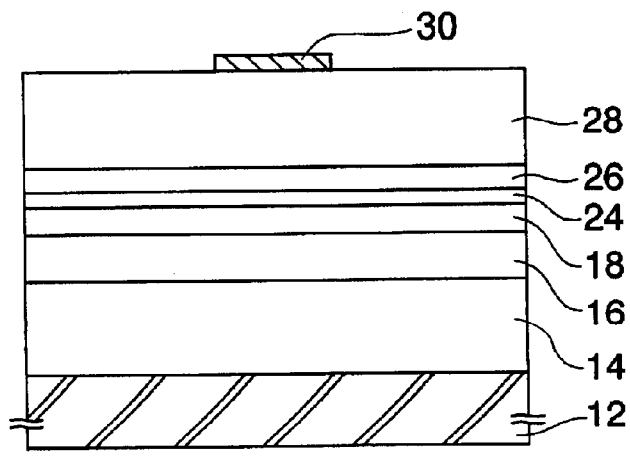
Figure 2G:
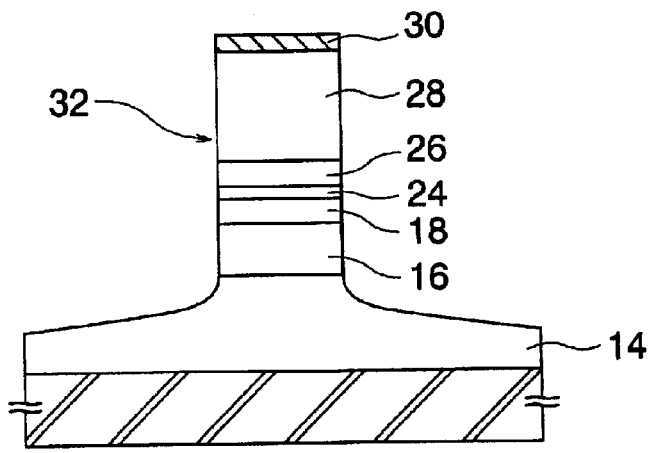

Thereafter, by using a plasma CVD system, a $SiN_x$ film is deposited on the entire wafer surface, followed by patterning the $SiN_x$ film in the shape of stripes by using photolithography and RIE (reactive ion etching), thereby forming $SiN_x$ masks 30, as shown in FIG. 2F. It is to be noted that FIGS. 2F and following figures, FIGS. 2G to 2I, are cross-sectional views of the DFB laser device taken along line I—I in FIG. 2E.

Subsequently, by using the SiNx masks 30 as etching masks, the p-InP cladding layer 28, the p-InP embedding layer 26, the diffraction grating 24, the p-InP spacer layer 18, and the MQW-SCH active layer 16 are etched down until a lower portion of the n-InP buffer layer 14 appears. Thus, as shown in FIG. 2G, a plurality of mesa stripes 32 are formed each including the MQW active layer 16 having a width of about 1.5 µm.

Figure 2H:
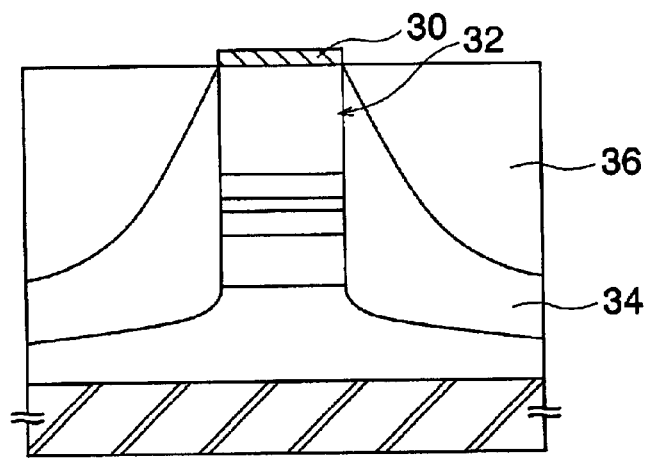

Thereafter, by using the SiN$_x$ masks 30 as selective growth masks or growth blocking masks, a p-InP layer 34 and an n-InP layer 36 are selectively grown on both sides of each mesa stripe 32, thereby forming a current confinement structure as shown in FIG. 2H.

Figure 2I:
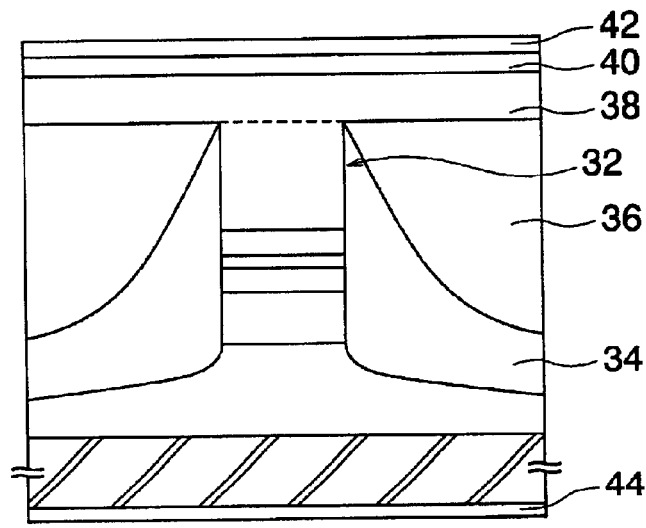

Subsequently, the SiN$_x$ masks 30 are removed to consecutively grow an 2-µm-thick p-InP cladding layer 38 and a heavily doped InGaAs contact layer 40 on the entire wafer surface as shown in FIG. 2I. On top of the InGaAs contact layer 40, a p-side electrode 42 made of a Ti/Pt/Au multilayer metal film is formed. In addition, the bottom surface of the n-InP substrate 12 is polished to make the substrate about 120 µm in thickness, and then an AuGeNi metal layer is formed as an n-side electrode 44.

Through the steps as described above, a plurality of DFB laser devices 46 are formed on the single wafer, each of the DFB laser devices having the laser structure shown in FIG. 4 and emitting a laser beam having a unique wavelength among the wavelengths different from one another by specified step wavelengths.

The wafer is cleaved after the above steps to have the shape of a bar (laser bar). One of the cleaved surfaces, or the front facet, of the laser bar is coated with an anti-reflection coat, whereas the other of the cleaved surfaces, or the rear facet, is coated with a high-reflection coat. These coats provide efficient emission of laser power from the front facet.

Thereafter, the laser bar is further processed to form a laser chip, which is then bonded onto the stem of a canned package to complete DFB laser devices that provide a lineup of C-band wavelengths of 1530 nm to 1560 nm.

In the sample of the DFB laser devices fabricated by the method of the above embodiment, the lasing frequency of the DFB laser device fabricated on the central region of the wafer was 1560 nm, whereas the lasing frequency of the DFB laser device fabricated on the outer periphery of the wafer, or 25 mm apart from the center of the wafer was 1530. The other DFB laser devices fabricated between the central area and the outer periphery of the wafer had medium frequencies so that the DFB laser device fabricated apart from the center had a shorter wavelength than the DFB laser fabricated near the center.

The DFB laser devices fabricated on the entire wafer surface had a threshold current of about 9 mA on average with a standard deviation σ=0.55 mA, and a slope efficiency of about 0.35 W/A on average with a standard deviation σ=0.015 W/A. In the present embodiment, the detuning amount Δλ is controlled to fall within the range of −10 nm to +10 nm, thereby making it possible to realize a plurality DFB laser devices fabricated substantially uniformly within the wafer surface and operative at a low threshold current with a high efficiency.

Embodiment 2

The present embodiment is another exemplary method for fabricating a DFB semiconductor laser device according to the present invention.

The present embodiment provides a method for fabricating a plurality of DFB laser devices at a time on an n-InP substrate of a 2-inch wafer by using a selective area growth by MOCVD, wherein the DFB laser devices have a specific distribution profile of the peak gain wavelengths for the active layers within the wafer surface and is provided with a lineup of C-band wavelengths of 1530 nm to 1565 nm.

Figure 5:
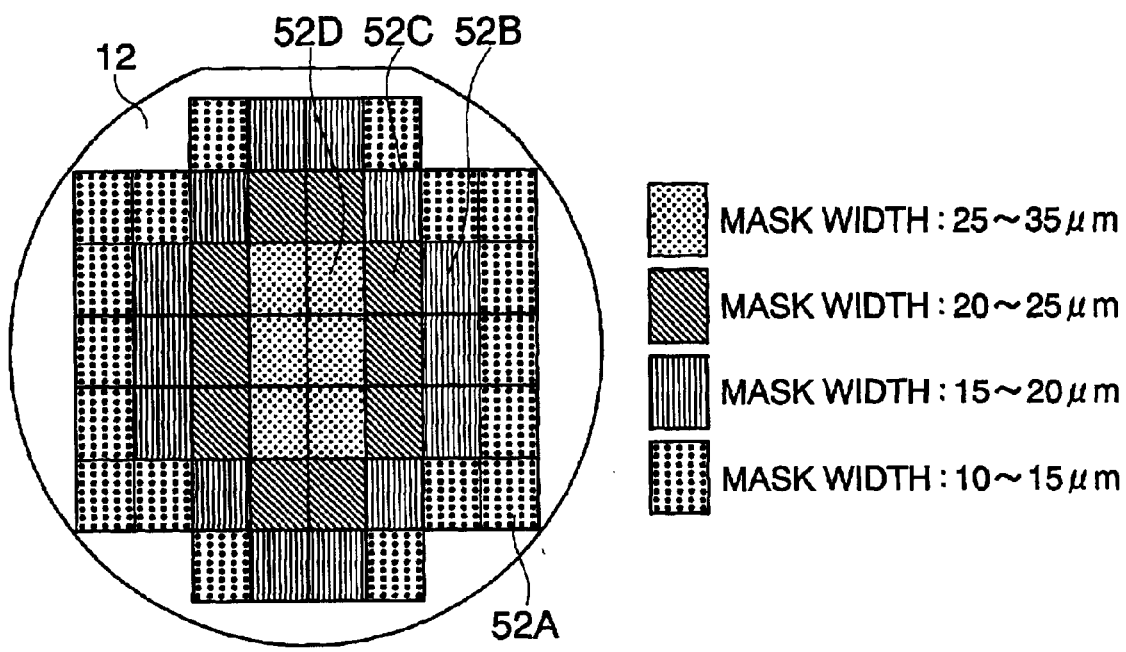
FIG. 5 is a top plan view of the wafer, tabulating the widths of the selective area growth masks in the respective regions of the wafer surface.

First, by using a plasma CVD system, a SiN$_x$ film is deposited on the entire surface of the n-InP substrate 12 of the wafer, followed by patterning the SiN$_x$ film to have the shape of stripes by using photolithography and RIE, to thereby form dielectric masks 52 having a gap width (opening width) of 25 µm between each two of the masks 52 and different mask widths which vary within the wafer surface, as shown in FIG. 5. FIG. 5 shows the arrangement of four types of dielectric masks 52A to 52D having unique mask widths of 25 to 35 µm, 20 to 25 µm, 15 to 20 µm, and 10 to 15 µm, respectively.

Thereafter, by a selective area growth by MOCVD using the dielectric masks 52, an n-InP buffer layer 14, a MQW-SCH quantum well active layer 16, a p-InP spacer layer 18, and an InGaAsP diffraction grating layer 20 are epitaxially grown in sequence on the 2-inch n-InP substrate 12 at a growth temperature of 600° C., thereby forming a layered structure such as shown in FIG. 2A.

Figure 6A:
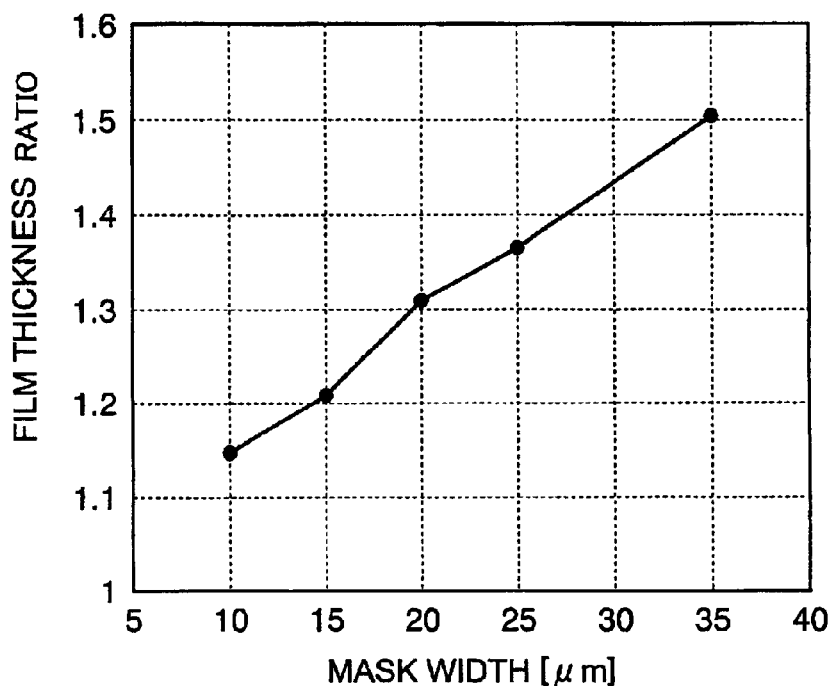
FIGS. 6A and 6B are graphs showing the dependency of the film thickness upon the mask width and the dependency of the bandgap wavelength upon the mask width, respectively.

In the selective area growth technique using the growth blocking masks (dielectric masks) 52 having different mask widths, a larger mask width provides a larger thickness for the grown film, as shown in the graph of FIG. 6A, wherein the film thickness is plotted on the ordinate against the mask width plotted on the abscissa. In FIG. 6A, the film thickness is plotted in terms of a ratio of the thickness of the film grown by the MOCVD step using the dielectric film for selective area growth to the thickness of the film grown by the MOCVD step using no such a dielectric film.

Along with the increase of the mask width, the transition energy between the quantum levels in the quantum well active layer of the layered structure grown between the masks is shifted toward a longer wavelength, resulting in a bandgap wavelength shifting toward a longer wavelength. That is, the mask width and the bandgap wavelength have the relationship such as shown in FIG. 6B, wherein the bandgap wavelength of the layer grown between the dielectric masks is plotted on the ordinate against the mask width of the dielectric masks plotted on the abscissa.

Figure 6B:
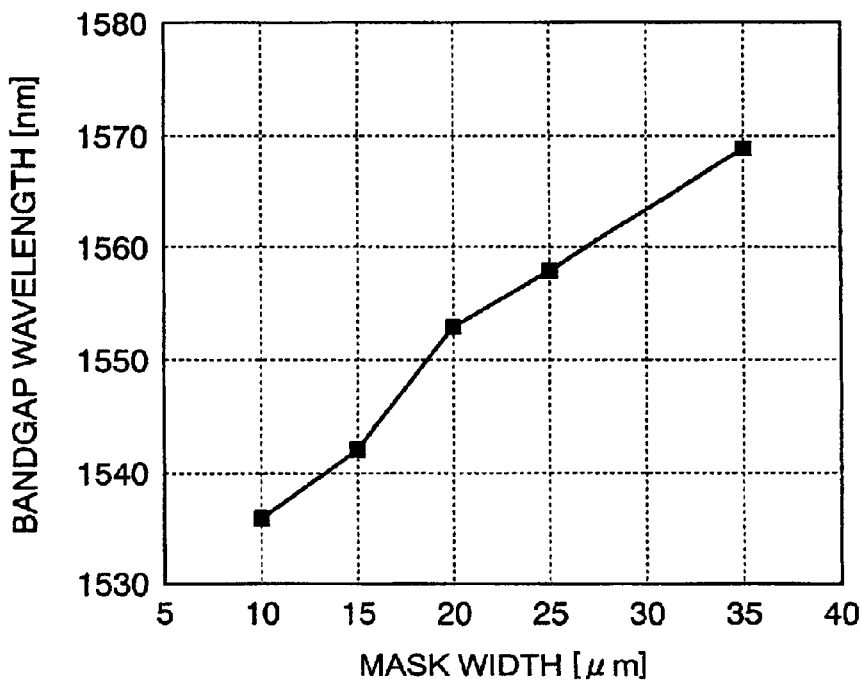
Figure 7:
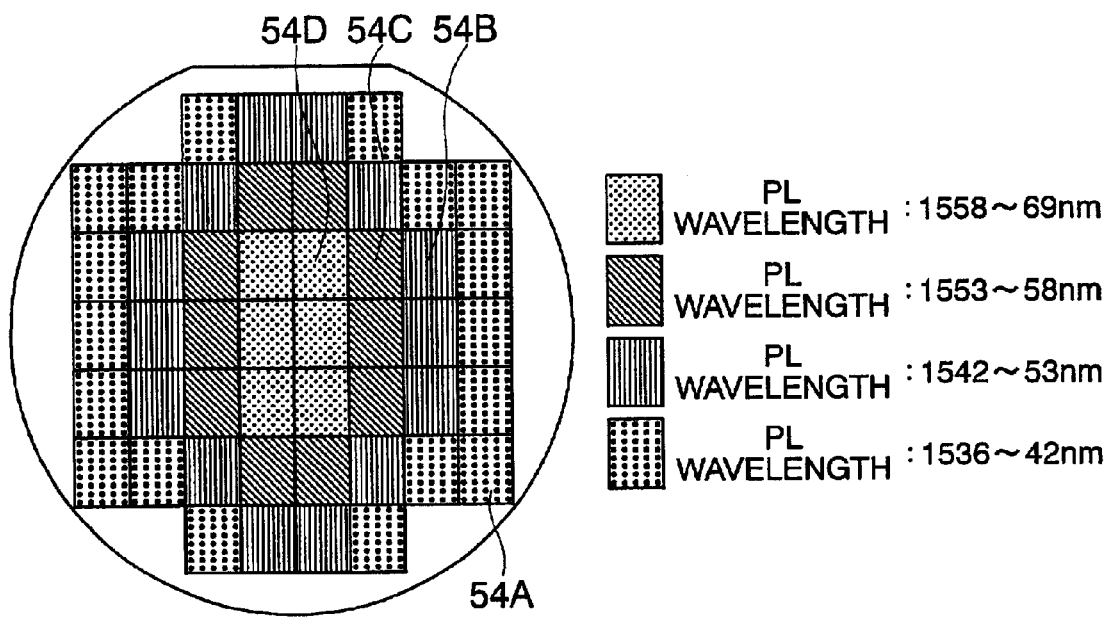
FIG. 7 is a top plan view of a wafer, illustrating the distribution of PL wavelengths within the wafer surface.

As understood from FIG. 6B, the growth blocking masks 52 having mask widths varied within the wafer surface, shown in FIG. 5, make it possible to form layered structures including active layers having different PL wavelengths or different peak gain wavelengths within the wafer surface. FIG. 7 shows the resultant four layered structures 54A to 54D, each emitting a unique PL wavelength, which are achieved by using the four types of dielectric masks 52A to 52D each having a unique mask width, as shown in FIG. 5.

In the present embodiment, the bandgap energy of the active layer 16 fabricated in the central region of the 2-inch wafer is designed to be about 1570 nm in terms of wavelength, and the bandgap energy of the active layer fabricated on the outer periphery of the wafer is designed to be about 1535 nm.

The p-InP spacer layer 18 and the InGaAsP diffraction grating layer 20 are 200 nm and 20 nm thick, respectively.

Thereafter, the photoluminescence wavelength (PL wavelength) is measured and mapped within the surface of the 2-inch wafer, on which the diffraction grating layer 20 is formed.

As shown in FIG. 7, the selective MOCVD step using the dielectric masks having different mask widths within the wafer surface allows the distribution of PL wavelengths to have a wavelength of around 1570 nm at the central region of the wafer and a wavelength of around 1535 nm at the peripheral region 25 mm apart from the center.

Subsequently, diffraction gratings are formed having periods that vary within the wafer surface in accordance with the mapping of the PL wavelengths.

In fabrication of the diffraction gratings, a resist for use with the electron beam (EB) lithography is first coated in a thickness of about 100 nm on the diffraction grating layer 20, to thereby form a resist film on the wafer. Subsequently, based on the predetermined detuning condition, patterned mask 22 for the diffraction gratings is formed by using an EB lithography system to provide the mask pattern having periods varied in the range of 239.8 nm to 245.3 nm in a plurality of regions within the wafer surface.

Figure 8:
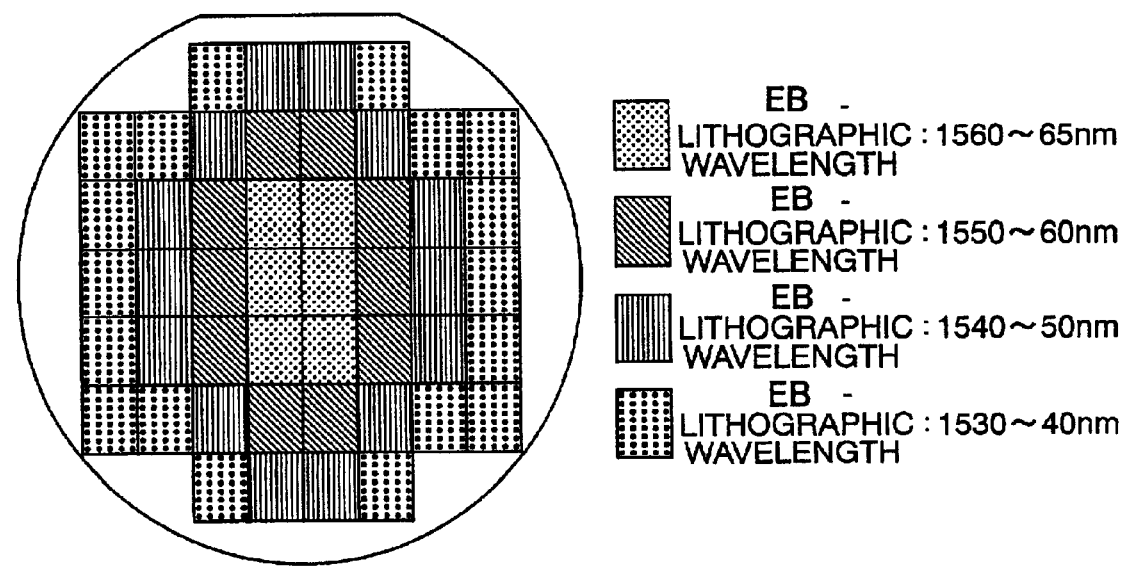
FIG. 8 is a top plan view of a wafer, illustrating the distribution of electron-beam (EB) lithographic wavelengths within the wafer surface.

As shown in FIG. 8, the lasing wavelengths are set at 1530 nm to 1565 nm in accordance with the PL wavelength mapping within the wafer surface. FIG. 8 shows the settings of the lasing wavelengths of the diffraction gratings to form the patterned mask 22 for the diffraction gratings in accordance with the PL wavelength mapping shown in FIG. 7. It is to be noted that the wavelength settings of the diffraction gratings are referred to as EB lithographic wavelengths in FIG. 8 for the purposes of convenience. The subsequent steps are similar to those of Embodiment 1.

The wafer after the above steps is cleaved to form a laser bar, which is coated with an anti-reflection coat at the front facet thereof and with a high-reflection coat at the rear facet, to allow an efficient emission of the laser power from the front facet.

Then, the laser bar is further processed to form a chip, which is then bonded to complete DFB laser devices that provide a lineup of C-band wavelengths of 1530 nm to 1565 nm.

In the sample of the DFB laser devices fabricated by the method of the present embodiment, the lasing frequency of the DFB laser device fabricated in the central region of the wafer was 1565 nm, whereas the lasing wavelength of the DFB laser device fabricated in the outer periphery, or 25 mm apart from the center, was 1530 nm. The other DFB laser devices had medium lasing wavelengths so that an outer DFB laser device had a shorter lasing wavelength.

The DFB laser devices fabricated on the entire wafer surface exhibited a threshold current of about 8.8 mA on average with a standard deviation $\sigma=0.55$ mA, and an average slope efficiency of about 0.38 W/A. In the present embodiment, the detuning amount $\Delta\lambda$ is controlled to fall within the range of $-10$ nm to $+10$ nm, thereby making it possible to realize a plurality of DFB laser devices fabricated uniformly within the wafer surface and operative at a lower threshold current and a higher efficiency.

In the present embodiment, the dielectric masks 52 are varied in the mask width, with a gap width (or opening width) maintained at a constant of 25 $\mu$m. However, the gap width may be varied within the wafer surface with a constant mask width, thereby making it possible to provide a desired distribution of bandgap wavelengths.

According to the present invention, the active layer is formed and then the distribution of peak gain wavelengths of the active layers is measured within the wafer surface. Then, diffraction gratings are designed and fabricated to have the periods in accordance with the distribution of the peak gain wavelengths measured. Thus, it is possible to fabricate a plurality of DFB laser devices on a single wafer at a time with a high degree of reproducibility, the DFB laser devices providing a lineup of wavelengths required as light sources for use in a WDM optical transmission system.

Furthermore, the detuning amount is controlled to fall within a certain constant range across the wafer surface, thereby making it possible to provide DFB laser devices fabricated uniformly within the wafer surface and operative at a lower threshold and a higher efficiency.

Since the above embodiments are described only for examples, the present invention is not limited to the above embodiments and various modifications or alterations can be easily made therefrom by those skilled in the art without departing from the scope of the present invention.

What is claimed is:

1. A method for fabricating a plurality of distributed feedback (DFB) semiconductor laser devices on a wafer surface, said DFB semiconductor laser devices including respective active layers having unique emission wavelengths different from one another, said method comprising the steps of:

forming the active layers;

measuring peak gain wavelengths of said active layers formed on said wafer surface;

determining respective periods of diffraction gratings for different portions of said active layers so as to allow detuning amounts of said DFB laser devices to fall within a specified range, based on a distribution of said measured peak gain wavelengths within said wafer surface;

forming diffraction gratings having respective periods; and forming an embedded layer, wherein said step of forming the respective diffraction gratings is preformed after said step of forming the active layers.

2. The method according to claim 1, further comprising the step of forming a plurality of compound semiconductor layered structures including respective said active layers, said active layers having peak gain wavelengths which vary on a region by region basis within said wafer surface.

3. The method according to claim 2, wherein said peak gain wavelengths have a distribution concentric with said wafer surface.

4. The method according to claim 2, wherein said layered structure forming step uses a selective area growth by MOCVD using a plurality of dielectric masks having different mask widths on a region by region basis.

5. The method according to claim 2, wherein said layered structure forming step uses a selective area growth by MOCVD using a plurality of dielectric masks having different mask widths in different annular regions, said annular regions being concentric with said wafer surface.

6. The method according to claim 2, wherein said diffraction gratings forming step forms a diffraction grating layer on said active layers with an intervention of a spacer layer.

7. The method according to claim 6, wherein said diffraction grating forming step uses an electron beam lithography.

8. The method according to claim 1, wherein said unique emission wavelengths are C-band or L-band wavelengths and have a difference of 30 nm or above between a maximum wavelength and a minimum wavelength of said unique emission wavelengths.

* * * * *